Sept. 5, 1961

H. C. RUCK 2,999,173

WAVE-CLIPPING CIRCUIT

Filed April 11, 1958

H. C. Ruck
INVENTOR.

BY [signature]
ATTORNEY 2,999,173
Patented Sept. 5, 1961

2,999,173

WAVE-CLIPPING CIRCUIT

Herbert C. Ruck, Canoga Park, Calif., assignor to The Bendix Corporation, a corporation of Delaware Filed Apr. 11, 1958, Ser. No. 727,956
11 Claims. (Cl. 307—88.5)

This invention relates to circuits for limiting the positive and/or negative amplitude excursions of an alternating potential to a predetermined value and thereby producing generally flat-topped waves. Such circuits are frequently referred to as clipping circuits, since they clip off the peaks of the waves.

Various clipping circuits are known, but one of the simplest and most common consists of a resistor and a diode connected in series with the source of the alternating potential to be clipped, the clipped output being taken off the diode. The diode has a relatively low forward resistance for potentials above a threshold potential, so the output potential is limited approximately to the threshold potential for input potentials exceeding the threshold potential. However, many diodes that are otherwise desirable have appreciable forward resistance above the threshold potential, so that the wave developed thereacross is rounded, rather than flat, unless the series resistor is very large, and load impedance requirements often rule out the use of sufficiently high resistors to produce the desired flatness.

An object of the present invention is to provide a simple, relatively low-impedance, diode-clipping circuit yielding flatter output waves than previous circuits, even with diodes of relatively high forward resistance.

A more specific object is to provide a diode-clipping circuit capable of compensating for the effect of the forward resistance of the diode.

Other objects and features of the invention will become apparent from the description to follow.

Briefly, the invention resides in a diode-clipping circuit that effectively neutralizes the potential drop across the diode resulting from its forward resistance by opposing it with an approximately equal potential. The forward resistance of the diode above its threshold potential is substantially constant, so that the potential drop thereacross varies substantially according to the waveform of the applied voltage. It is therefore neutralized by opposing it with a neutralizing wave also derived from and following the waveform of the applied potential. In accordance with the invention, this is accomplished with a very simple circuit.

A full understanding of the invention may be had from the following detailed description with reference to the drawing, in which:

FIG. 1 is a schematic diagram showing a simple circuit in accordance with the invention.

FIG. 1*a* is a diagram showing the circuit equivalent of the diode in FIG. 1.

Figure 1:
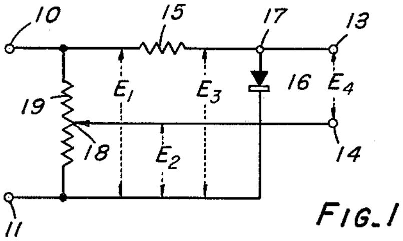

Referring to FIG. 1, a potential to be clipped is applied to a pair of input terminals 10 and 11, and the clipped output appears at a pair of output terminals 13 and 14. A resistor 15 and a diode 16 are connected in series between the input terminals 10 and 11. One output terminal 13 is connected to the junction 17 of the resistor 15 and the diode 16, and the other output terminal 14 is connected to a tap 18 on a voltage-dividing impedance 19 connected between the input terminals 10 and 11. The operation of this circuit is illustrated in the graph of FIG. 2, which shows the potentials in various parts of the circuit throughout one complete cycle of an alternating potential applied to the input terminals 10 and 11.

Figure 2:
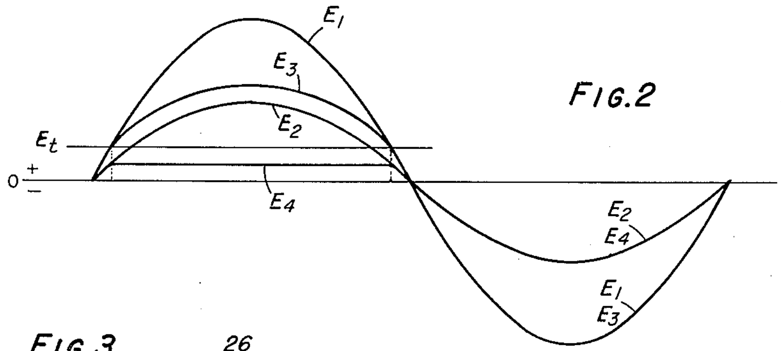
FIG. 2 is a graph illustrating the operation of the circuit of FIG. 1.

The input potential at the terminals 10 and 11 is a sinusoidal wave, as shown at $E_1$ in FIG. 2. Terminal 11 is taken as the reference base, so that the curve $E_1$ shows the relative variations of the potential at terminal 10. A lesser sinusoidal wave $E_2$ appears at the tap 18 on the voltage divider 19 and at the output terminal 14.

Figure 1A:
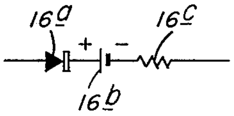

Potential $E_3$ is the potential drop across the diode 16, and its magnitude is a function of potential $E_1$, the resistance of the resistor 15, the threshold potential, and the forward resistance of the diode 16. The equivalent circuit of a solid diode, such as a germanium or silicon diode, is shown in FIG. 1*a*. It consists of a rectifier **16*a* having no forward resistance connected in series with a potential source 16*b* representing the threshold potential, and a resistor 16*c* representing the forward resistance. For all potentials appreciably above the threshold potential of the diode 16**, its forward resistance is quite constant, so the potential curve $E_3$ is coincident with the curve $E_1$ below the level of the threshold potential $E_t$ and of lesser magnitude than the potential $E_1$ above the threshold potential level. The output potential $E_4$ is obviously equal to the difference between the potential $E_3$ and the potential $E_2$.

Assuming that the tap 18 is positioned at the midpoint of the voltage-dividing impedance 19, potential $E_2$ will be half of potential $E_1$. Assuming further that the resistor 15 has resistance equal to the forward resistance of the diode 16, when the potential $E_3$ exceeds the threshold potential (during the major portion of the half cycle), the potential $E_3$ will be halfway between the potential $E_1$ and the threshold potential level $E_t$. Since $E_4$ at the output terminals 13, 14 is the difference between $E_3$ and $E_2$, $E_4$ is a flat-topped wave of half the amplitude of the threshold potential $E_t$. A perfect balance necessary to obtain a perfectly flat output wave $E_4$ is obtained only when $E_2$ and $E_3$ differ by a constant amount.

FIG. 1 shows a circuit containing only a single diode for clipping only the positive half wave. During each negative half wave, the diode 16 offers substantially infinite impedance, so that potential $E_3$ is substantially equal to potential $E_1$. The output potential $E_4$ is still equal to the difference between potential $E_2$ and $E_3$, so it is substantially equal to $E_2$ and half the magnitude of potential $E_1$. If a second diode oppositely poled with respect to diode 16 is connected in shunt thereto, then during the negative half wave in FIG. 2 all the curves $E_2$, $E_4$, $E_3$ and $E_1$ will be exactly the reverse of those in the first half cycle.

Figure 3:
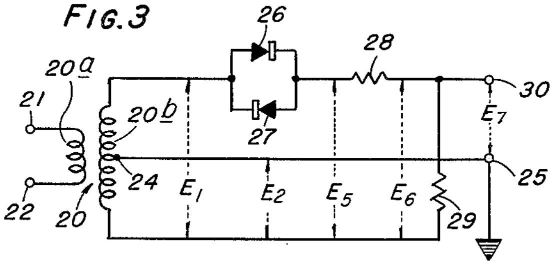
FIG. 3 is a schematic diagram of a modified circuit for practicing the invention.

FIG. 3 shows a modification of the circuit of FIG. 1 adapted to clip both the positive and negative half waves. This circuit comprises a transformer 20 having a primary winding **20*a* connected to input terminals 21 and 22, and a tapped secondary winding 20*b*. The tap 24 is connected to one output terminal 25, which may be grounded. Connected between the opposite ends of the secondary winding 20*b* is a pair of oppositely-poled diodes in shunt with each other and in series with two resistors 28 and 29. The other output terminal 30 is connected to the junction between the resistors 28 and 29**. Curves showing the performance of the circuit in FIG. 3 are shown in FIG. 4.

For the purpose of presenting a desired high impedance to the output of the transformer 20, the resistors 28 and 29 may be of substantial size and may be so large that the forward resistance of the diodes 26 and 27 is small in comparison. To obtain theoretically perfect results, the resistance of the resistor 29 is equal to the sum of the resistance of the resistor 28 and the forward impedance of either of the diodes 26 and 27. For the purpose of explanation, it will be assumed that the forward resistance of the diode is incorporated in the resistor 28 so that the potential $E_5$ at the junction between the diodes and the resistor 28 differs from the applied potential $E_1$ only by the threshold potential of the diode.

Figure 4:
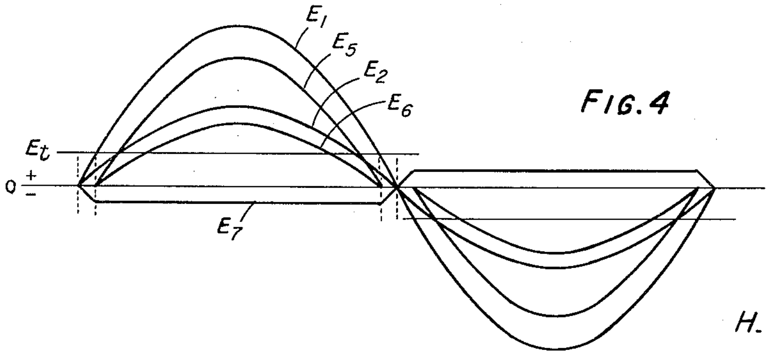
FIG. 4 is a graph illustrating the operation of the circuit of FIG. 3.

It will be observed from FIG. 4 that the potential $E_5$ is zero at the beginning of the positive half cycle until the potential $E_1$ rises to the threshold potential level $E_t$. Thereafter, potential $E_5$ at any point differs from the potential $E_1$ at the corresponding time only by the threshold potential. This potential $E_5$ is applied to the two resistors 28 and 29 in series, and since they are pressumed to be equal, the potential $E_6$ across the resistor 29 is one-half of potential $E_5$ at any instant. Throughout the major portion of the half cycle, $E_6$ differs in magnitude from $E_2$ by a constant amount equal to one-half of the threshold potential $E_t$. Therefore, the output potential $E_7$ is equal to $E_6-E_2$ and is as indicated in FIG. 4. It is substantially a flat-topped wave of amplitude equal to half the threshold potential and of polarity opposite to that of potential $E_1$.

Summarizing the potential relations during conduction of the diode:

$$E_7=E_6-E_2$$

$$E_6=\frac{E_5}{2}$$

$$E_5=E_1-E_t$$

$$E_2=\frac{E_1}{2}$$

Therefore:

$$E_7=\frac{E_1}{2}-\frac{E_t}{2}-\frac{E_1}{2}$$

or $$E_7=\frac{-E_t}{2}$$

It will be observed, therefore, that the amplitude of the clipped wave is a function only of the threshold voltage $E_t$ of the diode, and is independent of the applied potentials.

If the desired amplitude of clipping is greater than half the threshold potential of conventional solid diodes, the threshold potential can be increased by connecting a source of D.C. potential, such as a battery, in series with the diode 16 of FIG. 1 or each of the diodes 26 and 27 of FIG. 3. This, in effect, is simply increasing the potential of the equivalent source **16*b*** in FIG. 1*a*.

Figure 5:
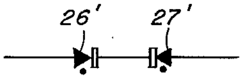
FIG. 5 is a diagram showing a variation of FIG. 3.

Alternatively, Zener diodes may be used in place of the diodes 26 and 27 in FIG. 3. However, as shown in FIG. 5, the Zener diodes 26' and 27' would be connected in series-opposing relation with each other instead of in shunt-opposing relation, as in FIG. 3. As is well known, Zener diodes have a relatively low threshold potential in the reverse conducting direction. The circuit of FIG. 3, modified as shown in FIG. 5, has the same characteristics as shown in FIG. 4, except that the output potential $E_7$ would have a magnitude equal to half the reverse conductive potential of the Zener diodes used.

Although for the purpose of explaining the invention a particular embodiment thereof has been shown and described, obvious modifications will occur to a person skilled in the art, and I do not desire to be limited to the exact details shown and described.

I claim:

1. In combination with a source of alternating current: first means for deriving from said source first and second alternating potentials in phase with each other and the first substantially larger than the second; second means having a substantially constant threshold potential below which it is nonconductive and above which it is conductive and a substantially constant impedance when conductive; third means having a substantially constant impedance at all potentials; means for applying said first potential to said second and third means in series relation for deriving across one of said second and third means a third potential; a pair of output terminals; and means for applying said second and third potentials in series-opposing relation to said output terminals; the ratio of the said impedances of said second and third means being such relative to the ratio of said first and second potentials that said third potential differs from said second potential by a constant value when said second means is conductive.

2. Apparatus according to claim 1 in which said second means comprises a diode.

3. Apparatus according to claim 1 in which said second means comprises two diodes connected in parallel and oppositely poled with respect to each other.

4. Apparatus according to claim 1 in which said second means comprises a Zener diode.

5. Apparatus according to claim 1 in which said second means comprises two Zener diodes connected in series and oppositely poled with respect to each other, 6. Apparatus according to claim 1 in which said second means comprises a diode and an impedance element in series with each other and the resistance of the impedance element is larger than the resistance of the diode.

7. Apparatus according to claim 6 in which said second means includes a second diode connected in parallel to and oppositely poled to said first-mentioned diode.

8. Apparatus in accordance with claim 1 in which said means for deriving said second potential comprises a voltage-dividing element connected across said first potential.

9. Apparatus according to claim 1 in which said means for deriving said first and second potentials comprises a transformer having a tapped secondary winding, said first potential being obtained from the ends of said winding and said second potential being obtained between one end of said winding and the tap thereof.

10. In a clipping circuit the combination of: a source of varying voltage to be clipped; a first impedance element ocnnected across the source of voltage; a series circuit across the impedance element including first means having a substantially constant threshold voltage below which it is nonconductive and above which it is conductive and having a substantially constant impedance when conductive, and second means having a substantially constant impedance at all voltages; one output terminal connected to the junction between the first and second means; and a second output terminal connected to a point intermediate the ends of the first impedance element dividing the first impedance element into two sections; said second means having an impedance related to the impedance of the first means when in a conductive condition in the ratio of the impedances of the two sections of the first impedance element.

11. In a voltage-clipping circuit, the combination of: a source of voltage to be clipped; a voltage divider connected across the voltage source; a diode having a substantially constant voltage threshold of conduction and a substantially constant impedance above the threshold of conduction; and a resistor connected in series with the diode across the voltage divider; one output connection connected to the junction between the diode and the resistor; and a second output connection at an intermediate point in the voltage divider; the resistor having a value related to the forward resistance of the diode in the ratio of the resistances of the two sections of the voltage divider defined by the second output connection.

(References on following page)

References Cited in the file of this patent

UNITED STATES PATENTS

| | | |
|---|---|---|
| 2,221,728 | Travis | Nov. 12, 1940 |
| 2,493,045 | Toth | Jan. 3, 1950 |
| 2,518,449 | Coe | Aug. 15, 1950 |
| 2,525,298 | Hughes | Oct. 10, 1950 |
| 2,851,614 | Emanuelsson | Sept. 9, 1958 |
| 2,867,735 | Kaufman | Jan. 6, 1959 |